United States Patent [19]

Brehmer et al.

[11] Patent Number: 4,480,230

[45] Date of Patent: Oct. 30, 1984

[54] LARGE SWING CMOS POWER AMPLIFIER

[75] Inventors: Kevin E. Brehmer; James B. Wieser, both of Newark; Carlos A. Laber, San Jose, all of Calif.

[73] Assignee: National Semiconductor Corporation, Santa Clara, Calif.

[21] Appl. No.: 510,713

[22] Filed: Jul. 5, 1983

[51] Int. Cl.³ .............................. H03F 3/45; H03F 3/30
[52] U.S. Cl. .................................... 330/255; 330/253; 330/260; 330/264; 330/265; 330/311
[58] Field of Search ............... 330/253, 255, 264, 265, 330/268, 269, 311

[56] References Cited

U.S. PATENT DOCUMENTS 4,053,795 10/1977 Cochran ..................... 330/253 X

Primary Examiner—James B. Mullins
Assistant Examiner—Steven J. Mottola
Attorney, Agent, or Firm—Gail W. Woodward; Paul J. Winters; Michael J. Pollock

[57] ABSTRACT

A CMOS Class AB power amplifier is disclosed wherein supply-to-supply voltage swings across low resistive loads are efficiently and readily handled. A high gain input stage including a differential amplifier driving a common source amplifier drives unity gain push-pull output stage. Included in the invention is circuitry to control the DC bias current in the output driver devices in the event of an offset between the push-pull unity gain amplifiers.

18 Claims, 7 Drawing Figures

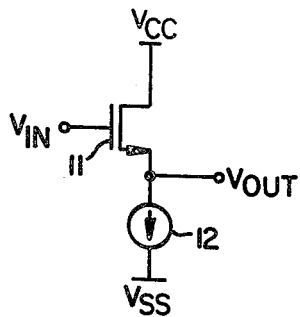
CLASS A AMPLIFIER (PRIOR ART)
FIG._1A.
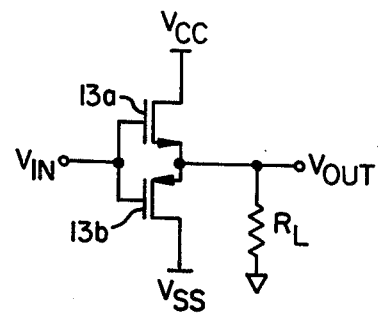
CLASS B AMPLIFIER (PRIOR ART)
FIG._1B.
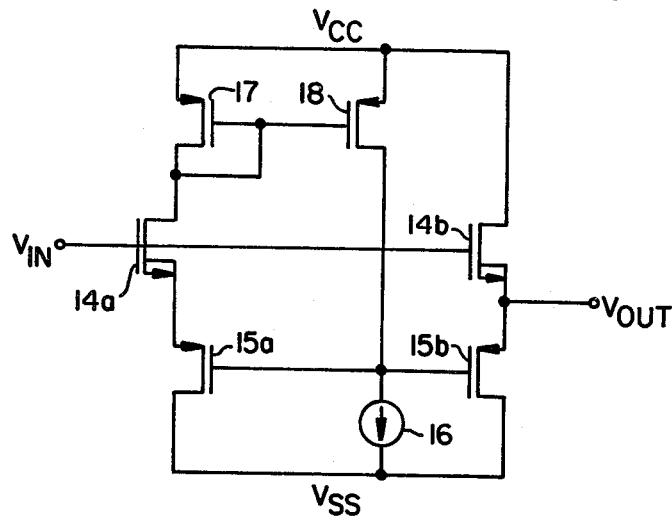
CLASS AB AMPLIFIER (PRIOR ART)
FIG._1C.
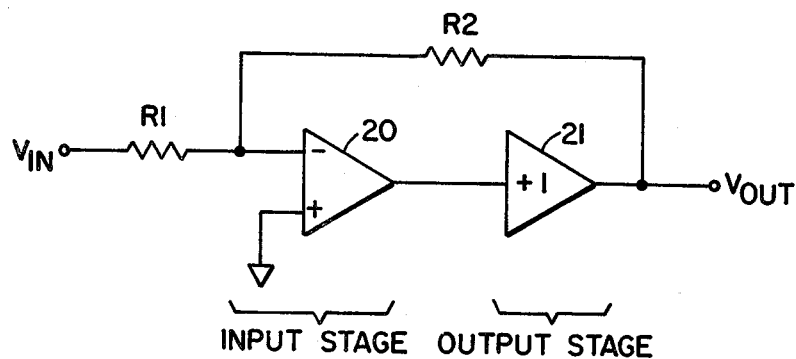
FIG._2.

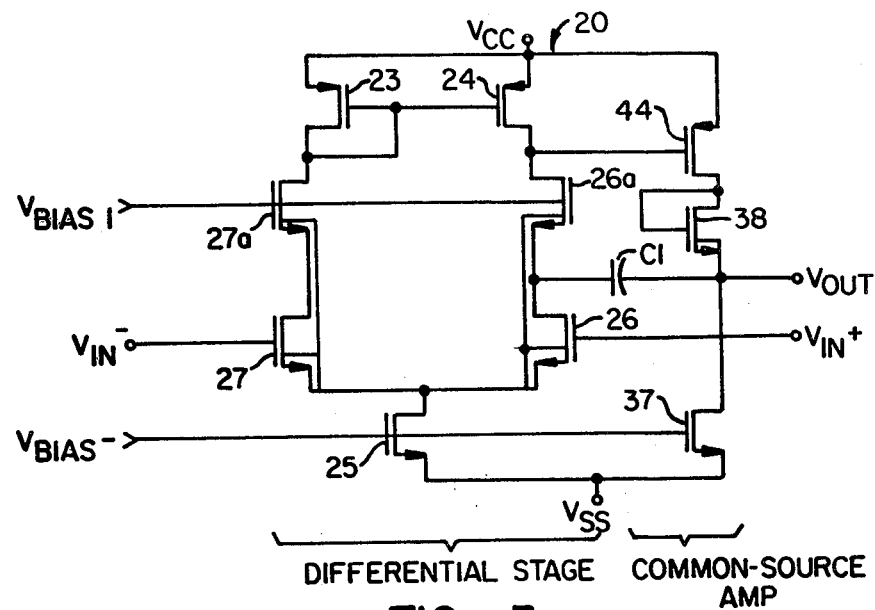
FIG._3.
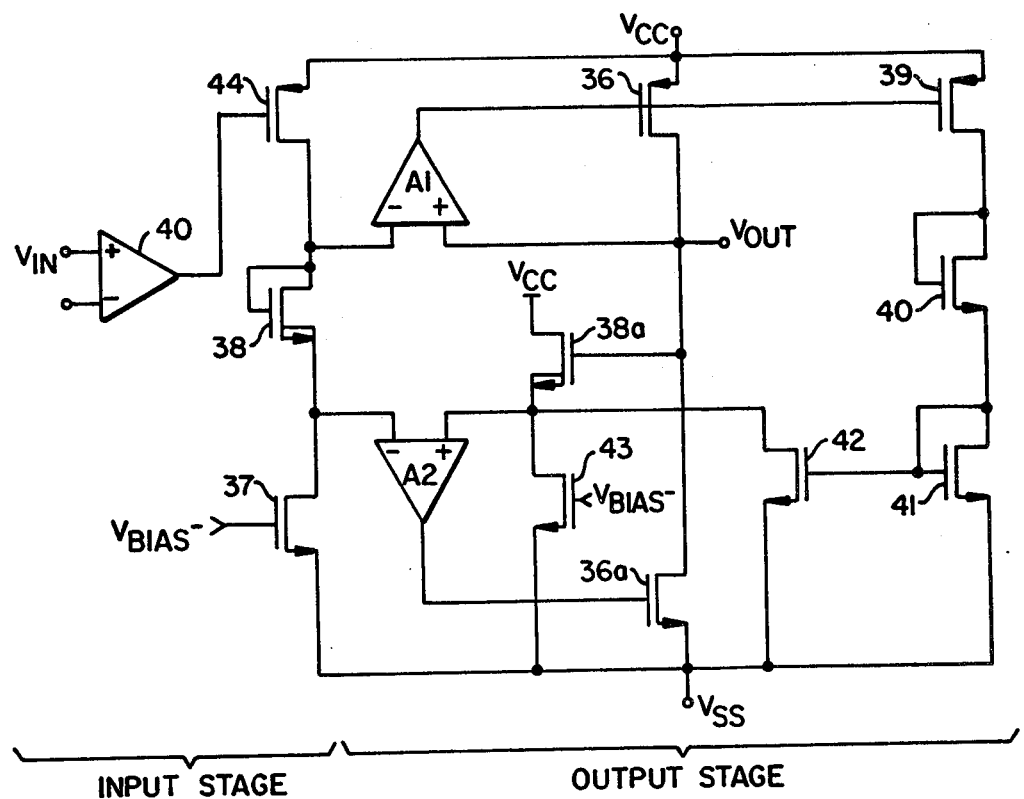
FIG._4.

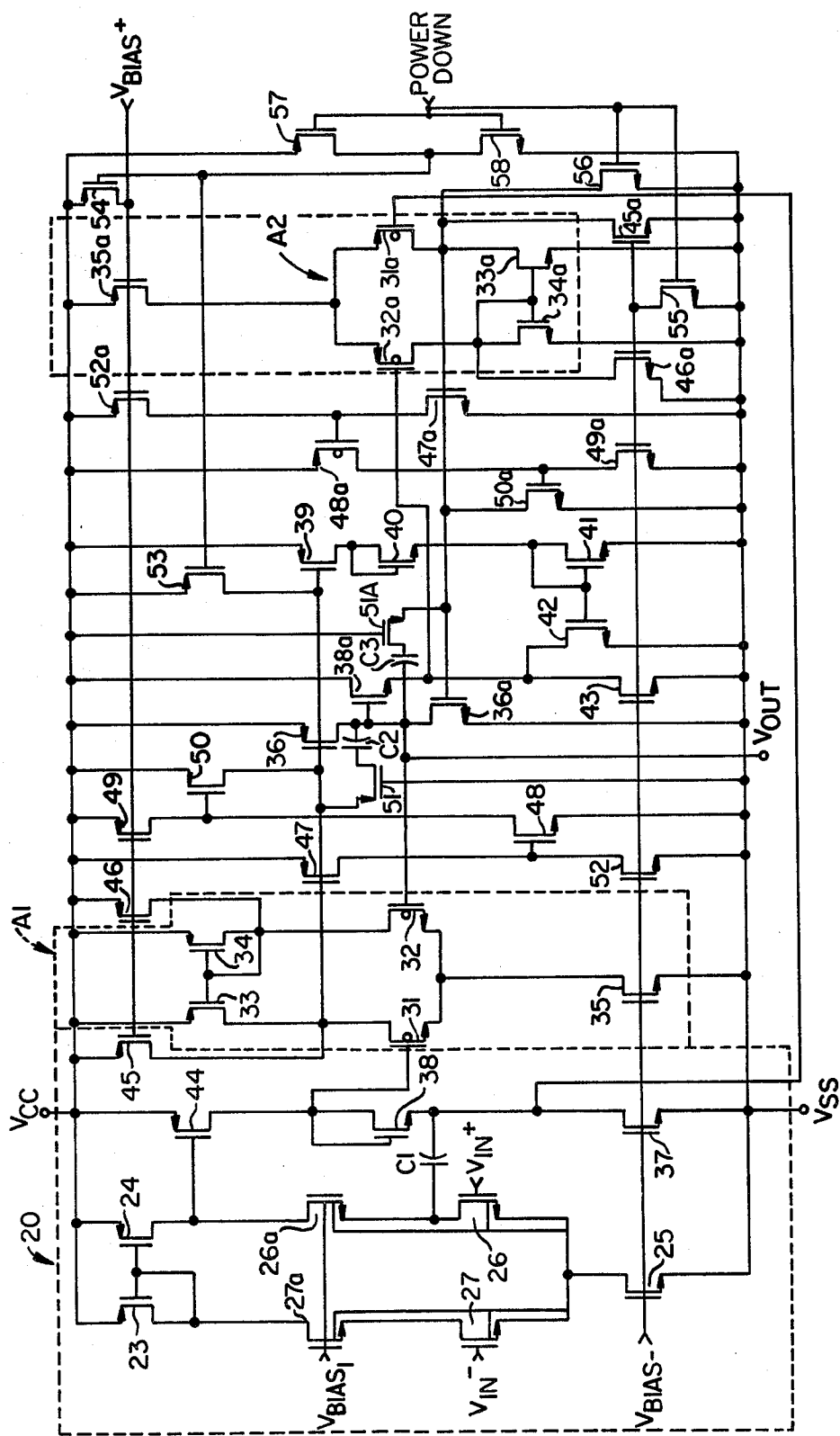
FIG._5.

LARGE SWING CMOS POWER AMPLIFIER

BACKGROUND OF THE INVENTION

1. Field of the Invention

The present invention relates to monolithic power amplifiers. More particularly, the present invention relates to a complementary metal oxide semiconductor (CMOS) Class AB power amplifier capable of output swings ranging from supply-to-supply. Other features of the design include: controlled DC bias current in the output devices and low distortion.

2. Description of the Prior Art

The development of integrated circuit technology has created unique problems when forming electronic circuits as monolithic structures. For example, linear CMOS circuits have been successful in the marketplace because of their low power consumption. However, problems unique to CMOS technology have presented a challenge to the design of CMOS linear circuits, that is, many common functional elements are not easily provided in a CMOS format or are unavailable altogether.

The limitations in prior art linear CMOS circuits have vexed manufacturers of integrated circuits for some time, and have prevented the production of an efficient, large dynamic range fully CMOS power amplifier. Prior art CMOS power amplifiers used output stage configurations that were subject to various limitations. FIG. 1 shows three of these prior art output stages: a Class A output stage (FIG. 1A), a Class B output stage (FIG. 1B), and a Class AB output stage (FIG. 1C).

The prior art Class A and Class AB output stages have a limited output voltage swing, and require large output driver devices in order to deliver the large amounts of current necessary to drive low resistive loads. The output voltage swing is limited by the threshold of the output driver devices and the maximum voltage the input of these output drivers can reach before the internal devices are driven out of saturation.

The prior art Class B output stage can drive large output voltage swings, however, it is subject to crossover distortion and uncontrollable DC bias current in the output driver devices. A configuration used to solve both of these problems has been provided in bipolar technology by including a diode circuit in series with the two inputs of devices 13a and 13b. CMOS technology is not amenable to such a solution due to the difficulty of forming such circuitry in CMOS devices having the necessary properties exhibited by bipolar devices.

SUMMARY OF THE INVENTION

The present invention provides a CMOS Class AB power amplifier wherein supply-to-supply output voltage swings across low resistive loads are efficiently and readily handled. A high gain input stage including a differential amplifier driving a common source amplifier, is coupled to drive a unity gain output stage.

The output stage includes two unity gain amplifiers in push-pull configuration. Each amplifier contains a differential input stage whose output controls the gate of the output driver device. The drain of the output driver device is directly fed back to the non-inverting input of the differential stage to form a non-inverting unity gain amplifier. The output stage current level is controlled in the event of an offset between the two push-pull amplifiers.

The push-pull output stage swings from voltage supply-to-supply as required by input signal levels and is capable of sourcing and sinking large amounts of current when driving low resistive loads. Control of DC bias current in the output driver devices is provided and maximum power conversion efficiency for the load is obtained for large output voltage swings.

The present invention solves the problem of crossover distortion and has very low total harmonic distortion. Implementation of the present invention can be made in any of the CMOS processes, including standard or inverted CMOS, metal gate CMOS, and single or double poly gate CMOS.

BRIEF DESCRIPTION OF THE FIGURES

FIGS. 1A-1C are simplified schematic diagrams of prior art Class A, Class B, and Class AB CMOS power amplifiers output stages;

FIG. 2 is a simplified block diagram of a typical application in which the present power amplifier invention is to be used;

FIG. 3 is a schematic diagram of a power amplifier input stage according to the present invention;

FIG. 4 is a detailed block diagram of a power amplifier output stage according to the present invention; and FIG. 5 is a schematic diagram of a push-pull CMOS Class AB power amplifier according to the present invention.

DETAILED DESCRIPTION OF A PREFERRED EMBODIMENT

The present invention is a large swing CMOS Class AB power amplifier which is capable of output voltage swings from supply-to-supply across low resistive loads. Other features of the design are controlled DC bias current in the output driver devices, and a push-pull output stage structure which improves power efficiency to the load.

FIG. 2 shows a block diagram of the typical application in which the power amplifier is to be used. The circuit consists of a high gain input stage 20, driving a unity gain output stage 21. Input stage 20 is shown in more detail in FIG. 3.

Input stage 20 comprises a differential amplifier driving a common source amplifier. The differential amplifier may be provided with either a large or small common mode range (CMR), depending on the application in which the power amplifier is to be used. In the exemplary embodiment of the invention, the power amplifier is used in an inverting unity gain configuration. Therefore, a differential stage with a low CMR can be used. The advantages of using a low CMR differential amplifier are higher gain, due to the cascode transistors 26a and 27a, and better power supply noise rejection, due to current feedback compensation techniques.

The differential stage is comprised of the differential transistor pair 26/27, the cascode pair 26a/27a, the current mirror pair 23/24 and the current sink transistor 25. Any difference in voltage between the input terminals $V_{in+}$ and $V_{in-}$, as seen on the gates of transistors 26 and 27, respectively, is amplified by the transistor pair 26/27 and converted to a single ended output at the drain of transistor 26a by the mirror pair 23/24.

The output of the differential stage drives a common source amplifier, which provides the output stage with a large signal input. The common source amplifier also provides approximately one half of the total AC gain of the input stage, and reduces the amount of compensation capacitance required to provide AC stability.

Output stage 21, shown in FIG. 2, is comprised of two non-inverting, unity gain, push-pull amplifiers, which are shown in FIG. 4 as amplifiers A1 and A2 and transistors 36 and 36a respectively. Each amplifier contains a differential amplifier input stage which produces an output signal that controls the gate of the output driver device consisting of transistors 36 and 36a (as shown in FIG. 4). The drain of the output driver device is directly fed back to the non-inverting input of the differential amplifier to form a non-inverting unity gain amplifier.

FIG. 4 is a simplified block diagram of the complete power amplifier; here the push-pull output stage can clearly be seen and understood. Amplifier A1 and transistor 36 form the unity gain amplifier for the positive half cycle of the output voltage swing and, conversely, amplifier A2 and transistor 36a form the negative half cycle circuit. Transistors 38a, 39-43 form a feedback network which controls the DC bias current in the output driver devices 36 and 36a in the event of an offset between the amplifiers A1 and A2. Amplifier 40, a differential amplifier, and devices 37, 38 and 44 comprise the input stage of the power amplifier.

For the sake of simplicity, only the circuit referring to the positive half output swing of the output stage is discussed in detail. The operation of the negative half swing circuit is an inverted mirrorimage of that of the positive half swing circuit. Components performing similar functions in each circuit are designated with a base designator for the positive half swing circuit (e.g., 31) and with an additional letter "a" for the negative half swing circuit (e.g., 31a), unless otherwise described herein.

A preferred embodiment of the invention is shown in schematic form in FIG. 5. The components that comprise the basic unity gain amplifier for controlling the positive swing include transistors 31-36. Transistors 31-35 are the functional elements that make up a differential amplifier whose output becomes the input to transistor 36. The negative input of the differential amplifier is connected to the output of the input stage and the positive input is connected to the drain of transistor 36.

The unity gain amplifier controlling the negative half swing consists of transistors 31a-36a. The differential amplifier circuit for the negative half swing operates in a manner similar to that for the positive half swing circuit, discussed above, except that the negative input to the differential amplifier is level shifted from that of the positive half swing circuit.

The output of the positive half swing circuit differential amplifier (transistors 31-35) drives the gate of transistor 36 to a level sufficient for the transistor to deliver adequate current to a resistive load to produce a voltage across the load which is equal to the voltage applied to the negative terminal of the differential amplifier. The differential amplifier used in the output stage has a large common mode range (CMR), which allows transistor 36 to source large currents to the load, while still being of a reasonable physical size for the incorporation into a monolithic circuit.

A large CMR is produced when transistors 31 and 32 have high threshold voltages. The high threshold voltages drive the common source node of the differential input pair further toward the voltage $V_{SS}$. As a result, transistor 36 receives a greater gate drive signal. Further enhancement of the CMR is obtained by connecting the substrate upon which transistors 31 and 32 are formed directly to $V_{SS}$, thereby modulating the source-substrate voltage of these transistors, and accordingly reducing the gain to the common source node of the differential amplifier. The modulation effect on transistors 31 and 32 provides additional gate drive to transistor 36, which allows transistor 36 to source additional current to the load.

In the preferred embodiment of the invention, transistor 36 sources large amounts of current to the load. Therefore, control of the DC bias current in the device is necessary to provide low power dissipation. The DC bias current in transistor 36 varies, depending on the input voltage offsets of amplifiers A1 and A2 as shown in FIG. 4, and as shown within the dashed lines of FIG. 5.

If the input offset voltage difference of amplifiers A1 and A2 is negligible, then the DC bias current of transistor 36 is controlled by the current mirror developed in the differential amplifier. Transistors 33 and 34 act as a current mirror in the balanced differential amplifier. Therefore, both drains and gates of transistors 33 and 34 should be at approximately the same potential. Since transistor 36 is connected to the drain of transistor 33, the potential on the gate of transistor 36 is the same as that of transistors 33 and 34. By scaling the device size of transistor 36 relative to transistor 33 and 34, the DC bias current becomes a scaled version of the current in the transistors 33 and 34.

If the input offset voltage difference of amplifiers A1 and A2 is substantial, transistors 38a-43 form a feedback loop to stabilize the current through transistors 36 and 36a. The feedback loop operates as follows: Assume that amplifier A1 has an offset such that transistor 36 begins to source excessive amounts of current. The excessive current is sensed by transistor 39 and is fed back to the source follower formed by transistors 38a and 43. The increase of current provided to transistor 38a increases the voltage drop of source follower, which causes less differential signal on amplifier A2 and less gate drive on transistor 36a. The decrease in gate drive on transistor 36a reduces the DC current in transistor 36a, and complete power amplifier feedback stabilizes the current through transistors 36 and 36a.

The output voltage has increased because the positive swing amplifier attempts to keep both of its inputs at the same potential. The complete power amplifier is in an inverting unity gain configuration. Amplifier feedback drops the voltage of the negative input of amplifier A1 in attempting to keep the output of the complete power amplifier at zero volts in the DC bias condition. Transistor 38 transfers this voltage drop at the negative input of amplifier A1 to amplifier A2 via transistor 38, thus balancing the input offset of amplifier A2. The offset that was initially introduced by amplifier A1 is absorbed by the source follower transistors 38 and 38a.

Because the output stage current feedback is not unity gain, some current variation in transistors 36 and 36a occurs. In the exemplary embodiment of the invention, a ±20 mV offset produces a 2:1 variation in DC current over temperature and process variations.

Since transistor 36 can supply large amounts of current, care is taken to ensure that this transistor is off during the negative half cycle of the output voltage swing. For large negative swings, the drain of transistor 35 pulls to $V_{SS}$, turning off the current source that biases the differential amplifier A1. As the bias is turned off, the gate of transistor 36 floats and tends to pull toward $V_{SS}$, turning on transistor 36.

In the preferred embodiment circuitry is also provided for ensuring that transistor 36 remains off for large negative voltage swings. As transistor 35 turns off, transistors 45 and 46 pull up the gates of transistors 36 and 34 respectively. As a result, transistor 36 is turned off and any floating nodes in the differential amplifier are eliminated. Positive swing protection is provided for the negative half cycle circuit by transistors 45a and 46a which operate in a manner similar to that described above for the negative swing protection circuit.

To avoid permanent damage to a monolithic integrated circuit incorporating the present invention as a result of excessive current flow, short circuit protection is provided at the output of the power amplifier. Transistor 47 senses the output current through transistor 36. In the event of excessively large output currents, the biased inverter formed by transistors 47 and 52 trips, thus enabling transistor 50. Once transistor 50 is enabled, the gate of transistor 36 is pulled up towards the positive supply $V_{CC}$, limiting the current transistor 36 can source.

The amount of phase shift an amplifier has at the unity gain frequency (FU) is a way of determining the AC stability of an amplifier. To provide good AC stability, the phase shift at FU should be typically less than or equal to 120 degrees, 90 degrees of which comes from a dominant pole and 30 degrees of which comes from a secondary pole, in a two-pole system.

AC stability in the present invention is achieved by providing a wide band output stage and by using compensation at the input stage to produce the dominant pole. Compensation provided in the input stage is a Miller multiplied capacitance C1. The compensation provided in the output stage is a series RC compensation comprising capacitor C2 and transistor 51. Similar AC compensation is provided for the negative half swing amplifier circuit by capacitor C3 and transistor 51a.

An additional feature of the present invention is the power down control circuit. Transistors 53–58 provide a logic function power down control circuit wherein the power amplifier and all nodes therein may be shut down. Such a feature is desirable in large scale integrated circuits where the power amplifier function may either not be required or may be required only at selected intervals during which operation of the circuit is desired. In either case, the power down circuit removes current flow from the power amplifier circuit and thus saves power. In this way, a monolithic circuit including the present invention as a component thereof operates more efficiently, the power amplifier drawing power only when selected as needed.

In operation a power down signal controls the input of an inverter formed by transistors 57 and 58. Accordingly, bias voltage $V_{bias+}$ is connected to the positive supply $V_{CC}$ via transistor 54. The gate of transistor 36 is also connected to $V_{CC}$ via transistor 53. Bias voltage $V_{bias-}$ is connected to negative supply $V_{SS}$ via transistor 55. The gate of transistor 36a is also connected to $V_{SS}$ via transistor 56. In this way, the power amplifier is shut down and the power dissipation during non-operation is eliminated. As a result, total operating efficiency is significantly improved.

An example of the performance achieved by an exemplary embodiment of the present invention is shown in the following specifications:

| CMOS POWER AMPLIFIER PERFORMANCE SPECIFICATIONS | | |
|---|---|---|
| Input Offset voltage | | ±25 mV |
| Unity Gain Bandwidth | Open Loop | 400 khz |
| Power Supply Rejection of $V_{CC}$ $V_{SS}$ | 0–4 khz | −60 dB |
| AVOL | No Load | 83 dB |
| Slew Rate | | 0.8 V/us |
| Settling Time | RL = 300 ohms Cl = 1000 pF | 3.1 us/4.0 us* |
| | RL = 600 ohms Cl = 500 pF | 3.5 us/2.2 us |
| | RL = 15k ohms Cl = 200 pF | 2.9 us/3.5 us |

*Settling time is determined to 0.1%, specification shows positive settling time, then negative settling time.

The foregoing was given for illustration and example. It should be appreciated that the present invention may be provided in various embodiments. For example, although an inverting amplifier configuration is shown wherein no input common mode signal is present, an input stage amplifier may also be provided wherein a common mode signal is included. Additionally, implementation of the present invention can be made in any of the CMOS processes, included standard or inverted CMOS, metal gate CMOS, and single or double poly gate CMOS. Therefore, the scope of the invention should be limited only by the breadth of the claims.

We claim:

1. A large swing CMOS power amplifier, comprising:
   an input differential amplifier operable to produce an amplified output signal at an output terminal in accordance with the difference of input signals coupled to amplifier input terminals;
   a common source amplifier, having an input terminal coupled to receive said input differential amplifier output signal and operable to produce an output signal in accordance therewith, wherein said input differential amplifier and said common source amplifier provide a high gain amplifier input stage;
   an output differential amplifier coupled to said common source amplifier to produce output signals at output differential amplifier output terminals in accordance with said common source amplifier output signal; and
   a push-pull output amplifier driven by said output differential amplifier and operable between a positive and a negative power source extreme to produce a large swing output signal in accordance therewith, wherein said output differential amplifier and said push-pull output amplifier provide a unity gain amplifier output stage.

2. The amplifier of claim 1, wherein said push-pull output amplifier further comprises a feedback loop providing direct negative feedback.

3. The amplifier of claim 2, wherein said feedback loop regulates operation of said output stage to prevent an offset current in said push-pull output amplifier.

4. The amplifier of claim 3, said push-pull output stage amplifier further comprising two transconductance amplifiers in push-pull configuration, a first of said amplifiers providing a positive signal half swing circuit and a second of said amplifiers providing a negative signal half swing circuit.

5. The amplifier of claim 4, further comprising means for disabling said first amplifier during a negative signal half swing cycle and means for disabling said second amplifier during a positive signal half swing cycle.

6. The amplifier of claim 5, further comprising means for sensing excessive current at said amplifiers to prevent continued operation of said amplifiers to thereby provide short circuit protection.

7. The amplifier of claim 6, further comprising:
an AC compensation capacitor at said amplifier input stage; and
a series RC compensation network at said amplifier output stage.

8. The amplifier of claim 7, further comprising:
a power down circuit, responsive to a power down signal, for removing power from said amplifier during selected intervals of non-use.

9. The amplifier of claim 1, provided in a monolithic CMOS circuit.

10. A low distortion, controlled DC bias current class AB CMOS power amplifier providing supply-to-supply output voltage swings, comprising:
a high gain input stage including a differential stage input circuit coupled to a common source amplifier; and
a unity gain output stage including a differential input stage having a first input coupled to said common source amplifier and driving a push-pull transconductance amplifier providing direct negative feedback to the other input of said differential input stage.

11. The amplifier of claim 10, wherein said push-pull transconductance amplifier further comprises a feedback loop providing direct negative feedback.

12. The amplifier of claim 11, wherein said feedback loop regulates operation of said output stage to prevent an offset current in said push-pull transconductance amplifier.

13. The amplifier of claim 12, said push-pull output stage further comprising two transconductance transistor amplifiers in push-pull configuration, a first of said transistor amplifiers providing a positive signal half swing circuit and a second of said transistor amplifiers providing a negative signal half swing circuit.

14. The amplifier of claim 13, further comprising means for disabling said first transistor amplifier during a negative signal half swing cycle and means for enabling said second transistor amplifier during a positive signal half swing cycle.

15. The amplifier of claim 10, further comprising means for sensing excessive current at said transistor amplifiers to prevent continued operation of said transistor amplifiers to thereby provide short circuit protection.

16. The amplifier of claim 15, further comprising:
an AC compensation capacitor at said amplifier input stage; and
a series RC compensation network at said amplifier output stage.

17. The amplifier of claim 16, further comprising:
a power down circuit, responsive to a power down signal, for removing power from said amplifier during selected intervals of non-use.

18. The amplifier of claim 10, provided in a monolithic CMOS circuit.

* * * * *